(12) United States Patent
Pozder et al.

(10) Patent No.: US 8,581,383 B2
(45) Date of Patent: Nov. 12, 2013

(54) 3-D SEMICONDUCTOR DIE STRUCTURE WITH CONTAINING FEATURE AND METHOD

(75) Inventors: Scott K. Pozder, Austin, TX (US); Ritwik Chatterjee, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 114 days.

(21) Appl. No.: 12/877,193

(22) Filed: Sep. 8, 2010

(65) Prior Publication Data

US 2010/0327440 A1    Dec. 30, 2010

Related U.S. Application Data

(62) Division of application No. 11/966,077, filed on Dec. 28, 2007, now Pat. No. 7,811,932.

(51) Int. Cl.
   *H01L 23/48* (2006.01)
(52) U.S. Cl.
   USPC ........... 257/692; 257/738; 257/778; 257/786; 257/E23.021
(58) Field of Classification Search
   USPC ............... 257/737, 738, 778, 779, 780, 797, 257/E23.068, E23.069, E23.179, 690, 692, 257/777, 786, E23.021; 438/661, 666, 674, 438/612, 613, 614, 652, 660
   See application file for complete search history.

(56) References Cited

U.S. PATENT DOCUMENTS

| 5,767,580 | A  | * | 6/1998 | Rostoker ........................ 257/737 |
| 5,903,059 | A  | * | 5/1999 | Bertin et al. ................... 257/785 |
| 6,365,967 | B1 |   | 4/2002 | Akram et al. |
| 7,087,458 | B2 |   | 8/2006 | Wang et al. |
| 7,378,735 | B2 |   | 5/2008 | Lin |
| 2005/0253274 | A1 |   | 11/2005 | Hikita et al. |
| 2006/0246703 | A1 |   | 11/2006 | Daubenspeck et al. |
| 2007/0001318 | A1 |   | 1/2007 | Starkston et al. |
| 2007/0013063 | A1 | * | 1/2007 | Khandekar et al. ........... 257/734 |
| 2007/0120253 | A1 |   | 5/2007 | Oh et al. |
| 2007/0152025 | A1 |   | 7/2007 | Fujimoto et al. |

FOREIGN PATENT DOCUMENTS

| EP | 0841700 A2 | 5/1998 |
| JP | 06120225 | 4/1994 |
| KR | 10-1998-0025889 A | 1/2000 |

OTHER PUBLICATIONS

Kostner, Hannes et al., "New Flip-chip on Chip Process Supercedes Embedded Technologies", 14th European Microelectronics and Packaging Conference & Exhibition; Jun. 23-25, 2003; pp. 1-6; Friedrichshafen, Germany.

* cited by examiner

*Primary Examiner* — Eduardo A Rodela

(57) ABSTRACT

A die-on-die assembly has a first die (10) and a second die (50). The first die (10) has a first contact extension (28,42) and a peg (32,44,45) extending a first height above the first die. The second die (50) has a second contact extension (68) connected to the first contact extension and has a containing feature (62) extending a second height above the second die surrounding the peg. The peg extends past the containing feature. Because the peg extends past the containing feature, lateral movement between the first and second die can cause the peg to come in contact with and be constrained by the containing feature. The peg and containing feature are thus useful in constraining movement between the first and second die.

20 Claims, 5 Drawing Sheets

3-D SEMICONDUCTOR DIE STRUCTURE WITH CONTAINING FEATURE AND METHOD

BACKGROUND

1. Field

This disclosure relates generally to semiconductor devices, and more specifically, to a 3-D semiconductor die structure with containing feature and method.

2. Related Art

When forming metal to metal die to die interconnections, corresponding pads of each die are sized large enough to overlay one another, taking account of placement misalignment. For large pads that are equally sized, bonding metal like tin (Sn) can run on the surface of the die, thus undesirably shorting adjacent interconnects not meant to be shorted.

There exists a problem of die movement after pick and place of die onto a wafer and during simultaneous bonding of die at the wafer level. The die movement can cause connect to connect shorting or misaligned opens during thermal compression die to wafer bonding.

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The embodiments of the present disclosure advantageously provide a method and apparatus for meeting and/or exceeding post place alignment requirements for high throughput die bonding at the wafer scale. Absent the embodiments of the present disclosure, when adhesives such as epoxies, waxes, or other organic adhesives with and without fluxing agents are used for temporary die attachment until bonding, the die could undesirably shift on the wafer. However, the embodiments of the present disclosure overcome such undesirable shifting of the temporary die attachment on the wafer until bonding.

According to one embodiment, the method and apparatus include a peg (45) and a containing feature (62) that advantageously allow for flow of organic adhesive out from a space where the peg lands during a place and bond process, as discussed herein. A method according to the embodiments of the present disclosure includes forming an asymmetric sized electroplated pegs or pads on a die and wafer such that the features that intermesh are smaller in area than landed features forming the die to wafer connections. In one embodiment, interlaced Cu peg and pad structures that are initially not in contact advantageously act as stops to die shifting when temporary adhesives such as waxes or epoxies with or without fluxing agents are used to hold die before bonding. Furthermore the Cu peg and containing feature act to stop the die shifting during the thermal compression bond process. The embodiments provide for process robustness and improved die to wafer alignment. Furthermore, the embodiments of the present disclosure can be used for stacked die on die, die on wafer and wafer on wafer parts.

Figure 1:
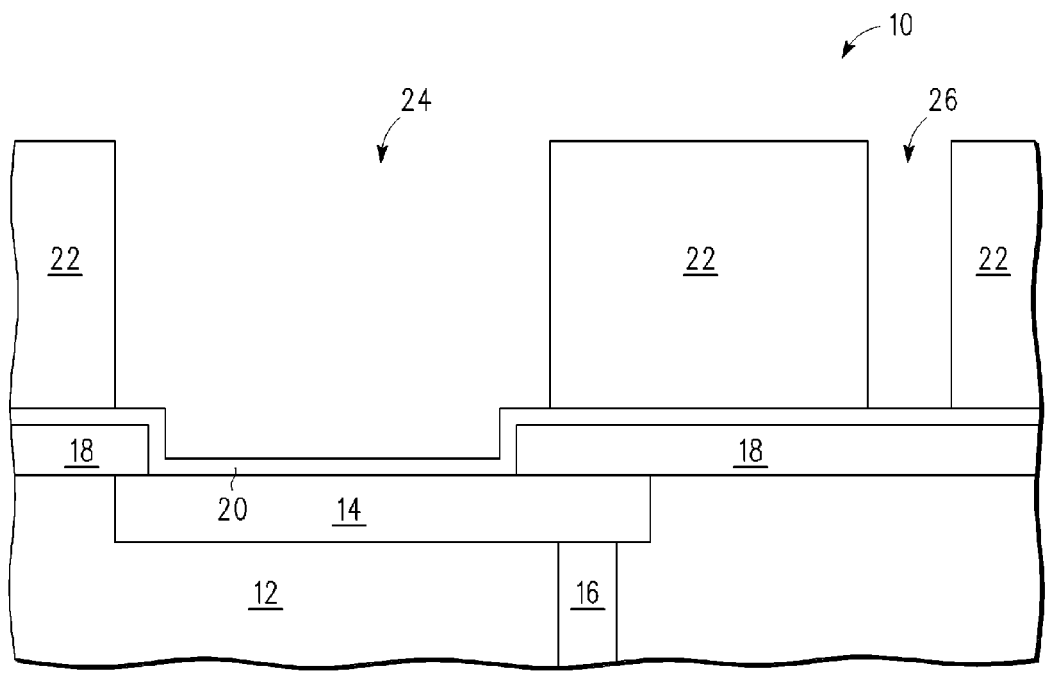
FIGS. 1-5 are cross-sectional views of a portion of a first die assembly during various steps in the manufacture of a 3-D semiconductor die structure with containing feature according to one embodiment of the present disclosure.

Turning now to the figures, FIGS. 1-5 are cross-sectional views of a portion of a first die 10 during various steps in the manufacture of a 3-D semiconductor die structure with containing feature according to one embodiment of the present disclosure. In FIG. 1, first die 10 includes a portion of a semiconductor die substrate 12 with active devices and interconnect. Semiconductor die 12 can include any semiconductor die having active devices. An electrically conductive or active contact pad 14 couples to underlying interconnects and/or active devices by way of metallization via 16. Contact pad 14 comprises an external contact for semiconductor die 12 and can include any suitable metal. In one embodiment, contact pad 14 comprises Cu. A passivation layer 18 overlies a top surface of an inter-level dielectric (ILD) layer of semiconductor die 12, which includes overlying a portion of contact pad 14, while leaving another portion of contact pad 14 exposed. Passivation layer 18 comprises any suitable passivation layer having a thickness on the order of 0.25 µm to 2.0 µm. For example, passivation layer 18 can comprise one or more of SiOx, SiN, SiON, organic films, or combinations thereof formed by suitable methods.

A seed layer 20 is formed overlying a top surface of passivation layer 18 and the exposed portion of contact pad 14. In one embodiment, seed layer 20 includes a barrier layer portion and a seed layer portion. The barrier layer portion is deposited prior to the seed layer portion. For example, seed layer 20 can comprise a Cu seed layer portion with a barrier portion, wherein the barrier layer portion can include TiW, TiN, W, or other suitable barrier material. The barrier material prevents undesirable diffusion of an overlying metal from diffusing back into the contact pad 14. The barrier layer portion of seed layer 20 can include a thickness on the order of 0.1 to 1.0 µm and the seed layer portion of seed layer 20 can include a thickness on the order of 0.1 to 1.0 µm for a total thickness of seed layer 20 on the order of between 0.2 to 2.0 µm. Seed layer 20 can be formed using any suitable technique, for example, physical vapor deposition (PVD) or chemical vapor deposition (CVD).

Referring still to FIG. 1, a patterned photoresist 22 is formed overlying a top surface of seed layer 20. Patterned photoresist 22 includes a first opening 24 located above the portion of the contact pad 14 which was previously exposed by an opening in passivation layer 18, with seed layer 20 overlying the previously exposed contact pad 14. Patterned photoresist 22 includes a second opening 26 overlying another portion of seed layer 20, wherein the second opening has a cross-sectional dimension less than a corresponding cross-sectional dimension of the first opening. Patterned photoresist 22 comprises any suitable photoresist formed by known lithographic techniques and can include a thickness on the order of approximately 13 to 25 μm, or a thickness on the order of at least one micron (1 μm) thicker that a plated contact and plated peg feature yet to be formed.

Figure 2:
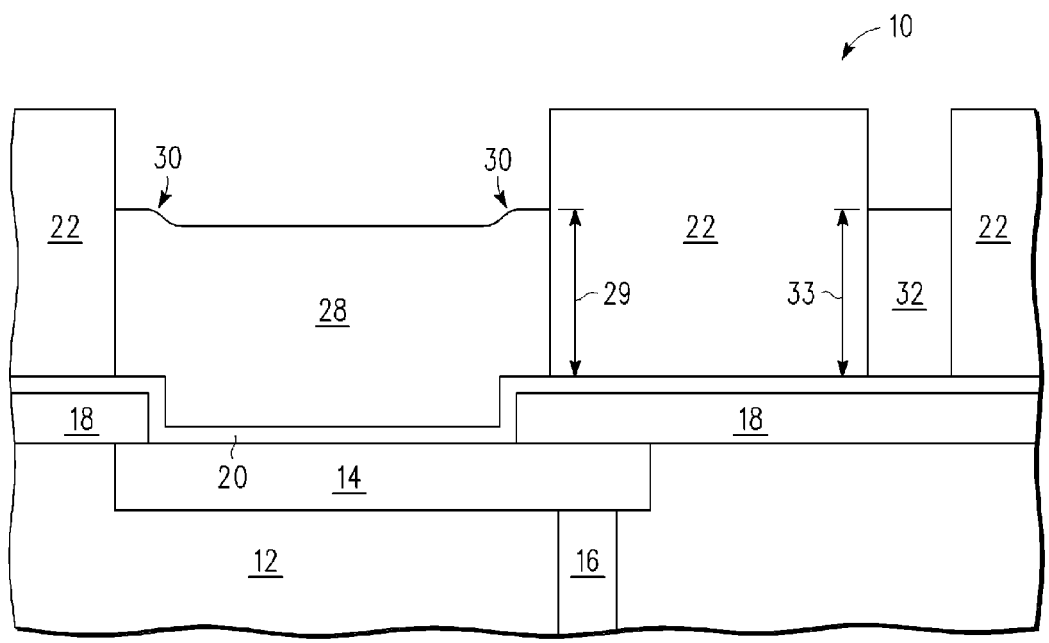

Turning now to FIG. 2, a metal is deposited using suitable plating techniques into openings 24 and 26 of FIG. 1 to form plated contact feature 28, having elevated corner portions 30, and plated peg feature 32. Elevated corner portions 30 of plated contact feature 28 can occur as a result of plating over corner edges of the seed layer 20 and passivation layer 18 overlying contact pad 14. In one embodiment, the plated contact feature 28 comprises a micropad, which is a fraction of a typical flip chip dimension, of a suitable two dimensional shape. The plated metal comprises any suitable metal for a given die assembly application, for example, Cu. Suitable plating techniques can include any suitable electroplating or electroless plating technique known in the art.

In one embodiment, plated contact pad 28 includes a width dimension on the order of between 15 and 54 μm. In addition, plated contact pad 28 includes a height dimension extending above the seed layer 20 overlying the passivation layer 18 by an amount illustrated by reference numeral 29, for example, on the order of 5.0 μm. In addition, the thickness of plated contact pad 28 should be sufficient for consuming an overlying metal (e.g., Sn), to be discussed further herein below, with respect to the formation of an intermetallic (e.g., $Cu_3Sn$) on top of the plated contact pad 28 (e.g., Cu). Similarly, in one embodiment, plated peg feature 32 includes a width dimension on the order of between 4 and 13 μm. In addition, plated peg feature 32 has a height dimension extending above the seed layer 20 overlying the passivation layer 18 by an amount illustrated by reference numeral 33, for example, on the order of 5.5 μm. In general, the height 33 is desirably on the order of approximately 0.5 μm greater than the height 29. Furthermore, the ratio of area of the plated contact feature 28 to area of the plated peg feature 32 is on the order of 2.75:1 to 36:1.

Figure 3:
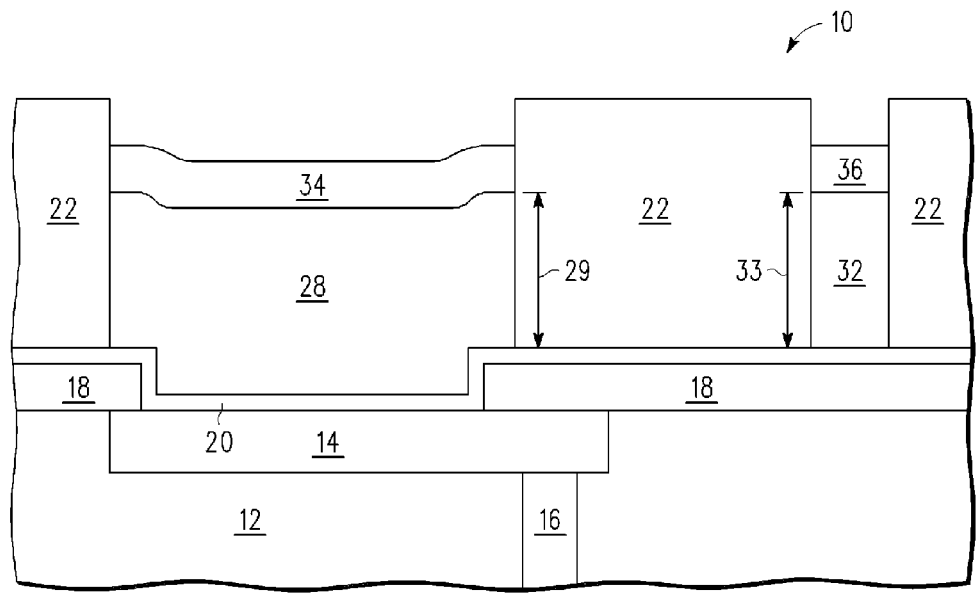

Referring now to FIG. 3, a metal for use in forming an intermetallic is deposited using suitable techniques overlying top surfaces of plated contact feature (or micropad) 28 and plated peg feature 32. The metal overlying plated contact feature 28 is indicated by reference numeral 34 and the metal overlying the plated peg feature 32 is indicated by reference numeral 36. In one embodiment, the metal 34 and 36 comprises Sn. Additional metals can include indium, gold, silver, silver-copper alloys, lead-tin, solder material, or combinations thereof, selected according to the requirements of a given die assembly application. Suitable techniques for depositing metal 34 and 36 can include any suitable electrolytic plating or immersion plating process known in the art.

Figure 4:
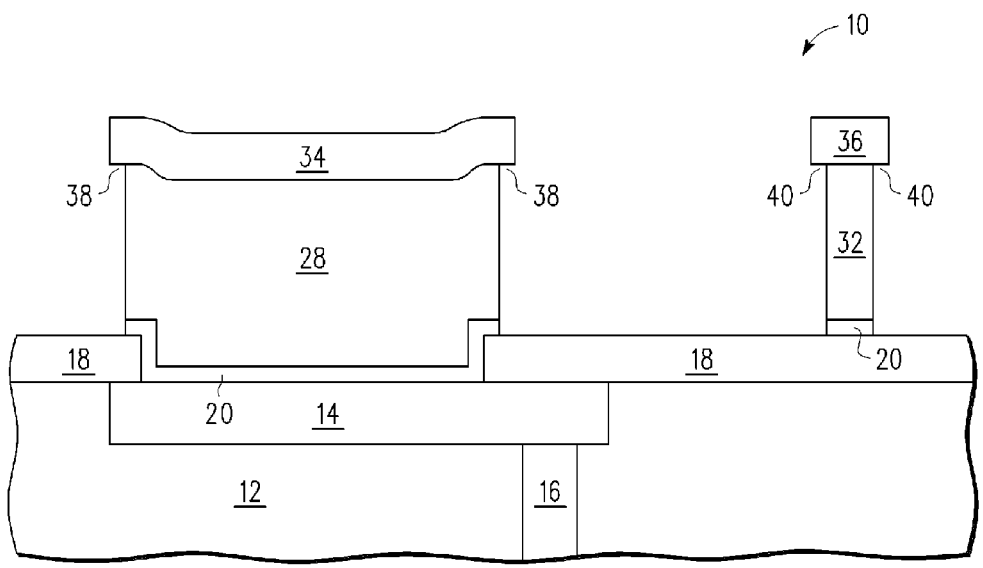

Subsequent to formation of metal 34 and 36, the patterned photoresist 22 is removed using suitable techniques, for example, using a suitable wet strip or dry etch. Removal of the patterned photoresist 22 exposes portions of seed layer 20, including the seed layer portion and barrier layer portion thereof in regions outside of the plated contact pad 28 and plated peg feature 32. Subsequent to removal of patterned photoresist 22, the exposed portions of seed layer 20 are removed using a suitable etch or strip, wherein the sidewalls of the plated contact pad 28 and plated peg feature 32 exposed by the seed layer removal are slightly oxidized. Seed layer 20, as shown in FIG. 4, remains under the plated contact pad 28 and the plated peg feature 32. In addition, removal of the seed layer 20 results in some undercutting of the plated contact feature 28 and the plated peg feature 32, wherein overhang regions 38 and 40 are produced about an upper perimeter of the plated contact feature 28 and the plated peg feature 32, respectively, and below corresponding metal layers 34 and 36, respectively. In other words, overhang regions 38 and 40 correspond to cantilevered portions of metal 34 and 36, respectively.

In one embodiment, overhang regions 38 and 40 of metal layers 34 and 36, respectively, overhang the underlying plated metal by an amount on the order of approximately 1 μm. In addition, the plated peg feature 32 is reduced in width during the process of removing the exposed portions of seed layer 20. In one embodiment, plated peg feature 32 is reduced to a width dimension on the order of between 2.0 and 12 μm.

Figure 5:
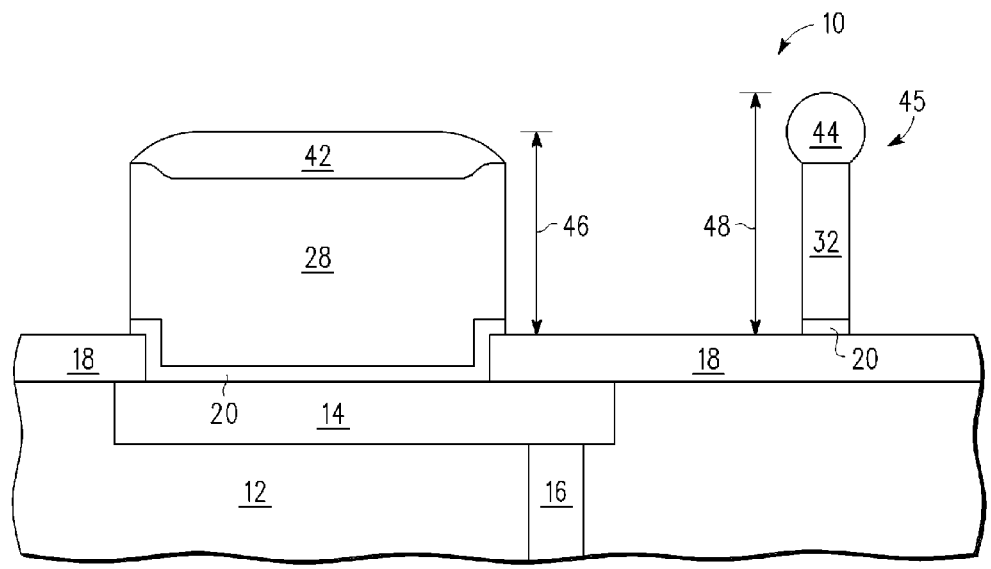

Referring now to FIG. 5, the structure of FIG. 4 is subjected to a rapid thermal anneal sufficient to reflow metals 34 and 36 into reflowed metals 42 and 44, respectively. The anneal is sufficient to cause a desired reflow of the metal, and with minimal formation of intermetallics, on the plated contact pad 28 and thinned peg feature 32. As a result of the larger width dimension of plated contact pad 28 and the desired reflow, the metal 34 overlying the top of the feature transforms during the anneal into a generally arched shape 42. As a result of the thinner dimension of thinned peg feature 32 and the desired reflow, the metal 36 overlying the top of the feature transforms during the anneal into a generally spherical shape 44. The reduced width peg feature 32 and the reflowed sphere overlying metal 44 together form a peg 45, for limiting a movement of die assembly 10 with respect to die assembly 50, to be discussed further herein below with reference to FIGS. 7 and 8.

According to one embodiment, the generally spherical shape 44 is characterized by a cross-sectional area on the order of between a minimum of 4 $μm^2$ to a maximum of 144 $μm^2$. In addition, plated contact pad 28 and reflowed metal 42 include a height dimension extending above the passivation layer 18 by an amount illustrated by reference numeral 46, for example, on the order of 8.0 μm. Similarly, in one embodiment, plated peg feature 32 and reflowed metal sphere 44 together have a height dimension extending above the passivation layer 18 by an amount illustrated by reference numeral 48, for example, on the order of 10.5 μm. In general, the height 48 is desirably on the order of approximately 2.0 to 2.5 μm greater than the height 46.

Figure 6:
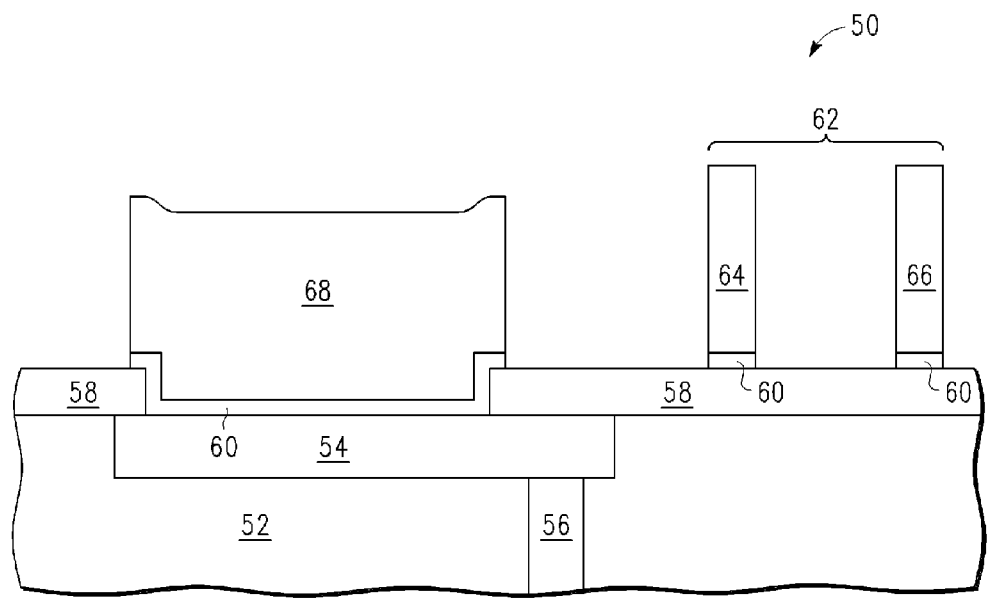
FIG. 6 is a cross-sectional view of a portion of a second die assembly during another step in the manufacture of a 3-D semiconductor die structure with containing feature according to one embodiment of the present disclosure.

FIG. 6 is a cross-sectional view of a portion of a second die assembly 50 during another step in the manufacture of a 3-D semiconductor die structure with containing feature according to one embodiment of the present disclosure. In FIG. 6, the second die assembly 50 includes similar features and is formed in a similar manner as with the first semiconductor die portion 10 of FIG. 5, with differences as noted herein. Second die assembly 50 includes a semiconductor die 52. Semiconductor die 52 can include any semiconductor die having active devices. An electrically conductive or active contact pad 54 couples to underlying interconnects and/or active devices by way of metallization via 56. Contact pad 54 comprises an external contact for semiconductor die portion 52 and can include any suitable metal. In one embodiment, contact pad 54 comprises Cu. A passivation layer 58 overlies a top surface of an inter-level dielectric (ILD) layer of semiconductor die 52, which includes overlying a portion of contact pad 54, while leaving another portion of contact pad 54 exposed. Passivation layer 58 comprises any suitable passivation layer having a thickness on the order of 0.25 μm to 2.0 μm. For example, passivation layer 58 can comprise one or more of SiOx, SiN, SiON, organic films, or combinations thereof formed by suitable methods.

A seed layer 60 is formed overlying a top surface of passivation layer 58 and the exposed portion of contact pad 54. In one embodiment, seed layer 60 includes a barrier layer portion and a seed layer portion. The barrier layer portion is deposited prior to the seed layer portion. For example, seed layer 60 can comprise a Cu seed layer portion with a barrier portion, wherein the barrier layer portion can include TiW, TiN, W, or other suitable barrier material. The barrier material prevents undesirable diffusion of an overlying metal from diffusing back into the contact pad 54. The barrier layer portion of seed layer 60 can include a thickness on the order of 0.1 to 1.0 μm and the seed layer portion of seed layer 60 can include a thickness on the order of 0.1 to 1.0 μm for a total thickness of seed layer 60 on the order of between 0.2 to 2.0 μm. Seed layer 60 can be formed using any suitable technique, for example, physical vapor deposition (PVD) or chemical vapor deposition (CVD).

Referring still to FIG. 6, a containing feature 62 comprising elements 64 and 66 of the containing feature, as well as plated contact pad (or micropad) 68 are formed in a similar manner as the plated peg feature 32 and plated contact pad (or micropad) 28 of FIGS. 2-4. In particular, a metal is deposited using suitable plating techniques into corresponding openings of a patterned photoresist (not shown) to form plated contact feature 68, having elevated corner portions, and plated feature elements 64 and 66 of containing feature 62. Plated feature elements 64 and 66 of containing feature 62 are spaced from one another by an amount as will be explained in connection with FIGS. 10 and 11 herein below. The plated metal of micropad 68 and containing feature 62 comprises any suitable metal for a given die assembly application, for example, Cu. Suitable plating techniques can include any suitable electroplating or electroless plating technique known in the art.

In one embodiment, plated contact pad 68 includes a width dimension on the order of between 15 and 54 μm. In addition, plated contact pad 68 includes a height dimension extending above the seed layer 60 overlying the passivation layer 58 by an amount, for example, on the order of 5.0 μm. In addition, the thickness of plated contact pad 68 should be sufficient for consuming an overlying metal (e.g., Sn), to be discussed further herein below, with respect to the formation of an intermetallic (e.g., $Cu_3Sn$) adjacent the top of the plated contact pad 68 (e.g., Cu). Similarly, in one embodiment, feature elements 64 and 66 of containing feature 62 include a width dimension on the order of between 4 and 13 μm. In addition, feature elements 64 and 66 of containing feature 62 have a height dimension extending above the seed layer 60 overlying the passivation layer 58 by an amount on the order of 5.5 μm. In general, the height with respect to feature elements 64 and 66 of containing feature 62 is desirably on the order of approximately 0.5 μm greater than the height of the plated contact feature or micropad 68. Furthermore, the ratio of area of the plated contact feature 68 to area of at least one of the containing feature elements 64 and 66 of containing feature 62 is on the order of 2.75:1 to 36:1.

Figure 7:
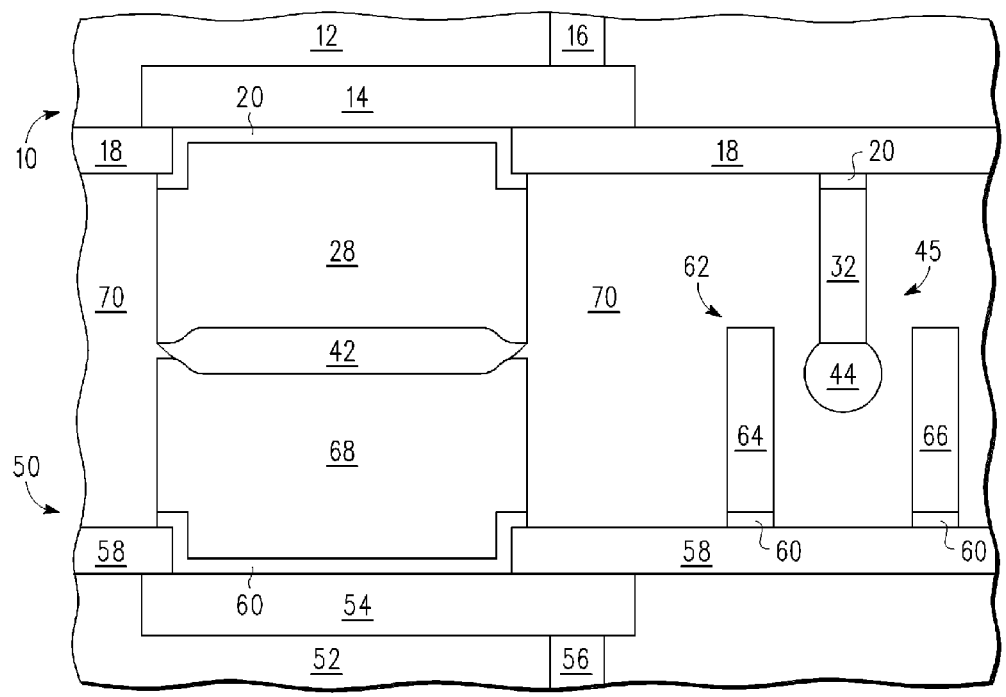
FIG. 7 is a cross-sectional view of placement of the portion of the first die assembly with respect to the portion of the second die assembly during another step in the manufacture of a 3-D semiconductor die structure with containing feature according to one embodiment of the present disclosure.

FIG. 7 is a cross-sectional view of placement of the first die assembly 10 with respect to the second die assembly 50 during another step in the manufacture of a 3-D semiconductor die structure with containing feature 62 according to one embodiment of the present disclosure. In particular, a predefined quantity of suitable material 70 is dispensed in a given location upon a surface of die assembly 50, and upon placement of die assembly 10 over die assembly 50, material 70 is distributed between the two die assemblies. Distribution of material 70 can occur, for example, as a result of capillary action of the material between the two die assemblies, compression of material between the die assemblies, or other manner. Material 70 can comprise, for example, a suitable wax material, or one or more organic adhesives, such as an epoxy. Material 70 may also comprise air. In a subsequent processing step, the material 70 may be removed via suitable techniques, such as evaporation, as will be better understood in connection with the discussion of FIGS. 10 and 11, herein below.

Placement of die assembly 10 over die assembly 50 includes disposing micropad 28 over micropad 68. In addition, peg 45 is located within the region between elements 64 and 66 of the containing feature 62. Given that the height of peg 45 is greater than a combined height of micropad 28 and reflowed metal 42, above the corresponding passivation layer 18, and given that the height of elements 64 and 66 of containing feature 62 is greater than a height of micropad 68, then upon placement of die assembly 10 over die assembly 50, the tip of peg 45 extends below the tips of elements 64 and 66 of containing feature 62, for example, as illustrated in FIG. 7. As a result, subsequent to placement of the first die assembly 10 over second die assembly 50, first die assembly 10 is limited in its ability to move laterally with respect to second die assembly 50.

In particular, should first die assembly 10 move to the right hand side of FIG. 7, its movement will be limited when peg 45 physically contacts with element 66 of containing feature 62. In addition, should first die assembly 10 move to the left hand side of FIG. 7, its movement will be limited when peg 45 physically contacts with element 64 of containing feature 62. In addition, movement of one die assembly with respect to the other is hydraulically damped as a result of the presence of material 70 between the two die assemblies.

Figure 8:
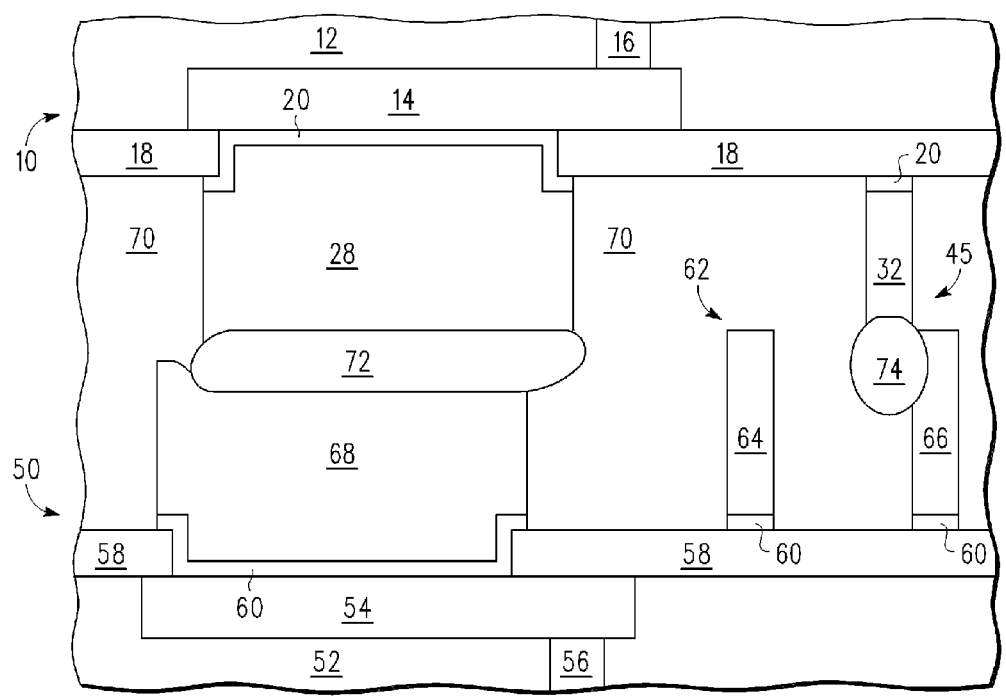
FIG. 8 is a cross-sectional view of thermal compression bonding of the portion of the first die assembly with the portion of the second die assembly during another step in the manufacture of a 3-D semiconductor die structure with containing feature according to one embodiment of the present disclosure.

FIG. 8 is a cross-sectional view of thermal compression bonding of the first die assembly 10 with the second die assembly 50 during another step in the manufacture of a 3-D semiconductor die structure 76 with containing feature 62 according to one embodiment of the present disclosure. Subsequent to placement of first die assembly 10 over second die assembly 50, the combined structure is processed via thermal compression bonding, using suitable equipment and processing known in the art for thermal compressing bonding. Generally, the location for placement of the first die assembly 10 over the second die assembly 50 occurs in a physical location different from the location of the thermal compression bonding. During movement from the placing station to the thermal compression bonding station, the placed first die assembly 10 may have moved laterally with respect to the second die assembly 50; however, such lateral movement is limited by the presence of peg 45 of the first die assembly 10 within containing feature 62 of the second die assembly 50.

During thermal compression bonding, the first die assembly 10 is compressed on second die assembly 50 by an amount sufficient for moving organic material 70 and to allow for a desired bonding to occur. For example, in one embodiment, the bonding pressure is on the order of 4.5 psi to 27 psi. In another embodiment, the bonding force comprises on the order of 1000 to 6000 Newtons for a 200 mm wafer. In addition, the thermal portion of thermal compression bonding includes elevating the temperature during processing to a desired level sufficient to form intermetallics. In one embodiment, the bonding metal comprises Sn, and the corresponding plated pads (or micropads) comprise Cu. In such an instance, the temperature for thermal compression bonding includes greater than 232° C. to melt the Sn and form $Cu_3Sn$ and $Cu_6Sn_5$ intermetallics.

In other words, thermal compression causes intermetallics to be formed between the reflowed metal 42 and micropad 28 of first die assembly 10 and micropad 68 of second die assembly 50 of FIG. 7, and in particular into the intermetallic bond 72 of FIG. 8. FIG. 8 also illustrates an example of the first die assembly 10 having moved laterally with respect to the second die assembly 50, wherein the movement was limited by peg 45 contacting element 66 of containing feature 62. As a result, in addition, the thermal compression causes reflowed metal 44 on thinned peg feature 32 of peg 45 to form intermetallics between the reflowed metal 44 and thinned peg feature 32 of the first die assembly 10 and element 66 of second die assembly 50 of FIG. 7, and in particular, into the intermetallic bond 74 of FIG. 8. Formation of the intermetallics 72 and 74 results in a consumption of metal of corresponding features of first die assembly 10 and second die assembly 50.

Figure 9:
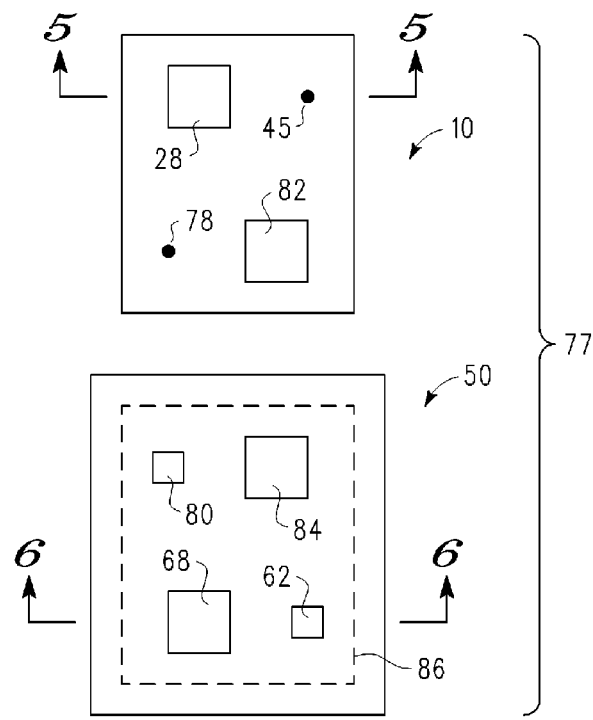
FIG. 9 is a top down view of adjoining faces of the portion of the first die assembly and the portion of the second die assembly in the manufacture of a 3-D semiconductor die structure with containing feature according to one embodiment of the present disclosure.

FIG. 9 is a top down view of adjoining faces of the first die portion 10 and the second die portion 50 used in the manufacture of a 3-D semiconductor die structure with containing feature according to one embodiment of the present disclosure. In particular, adjoining complementary faces of the first die portion 10 and the second die portion 50 are illustrated as being split apart, further as indicated by reference numeral 77. The face of first die portion 10 includes micropads 28 and 82 (with an overlying reflowed metal not shown) and pegs 45 and 78, wherein micropad 82 and peg 78 are similar to micropad 28 (with the overlying reflowed metal) and peg 45, respectively, as previously discussed. The cross-section illustrated in FIG. 5 is taken along line 5-5 on first die portion 10 of FIG. 9. The face of second die portion 50 includes micropads 68 and 84 and containing features 62 and 80, wherein micropad 84 and containing feature 80 are similar to micropad 68 and containing feature 62, respectively, as previously discussed. The cross-section illustrated in FIG. 6 is taken along line 6-6 on second die portion 50 of FIG. 9. When adjoining faces are placed one atop the other, micropad 28 (with reflowed metal 42 not shown in FIG. 9) overlies micropad 68, micropad 82 (with a reflowed metal not shown in FIG. 9) overlies micropad 84, peg 45 is disposed within containing feature 62, and peg 78 is disposed within containing feature 80. As a result of having pegs and containing features between the first and second die assemblies, placement and any subsequent movement of the first die portion with respect to the second die portion is contained with a region, for example, as defined by boundary 86.

Figures 10, 11:
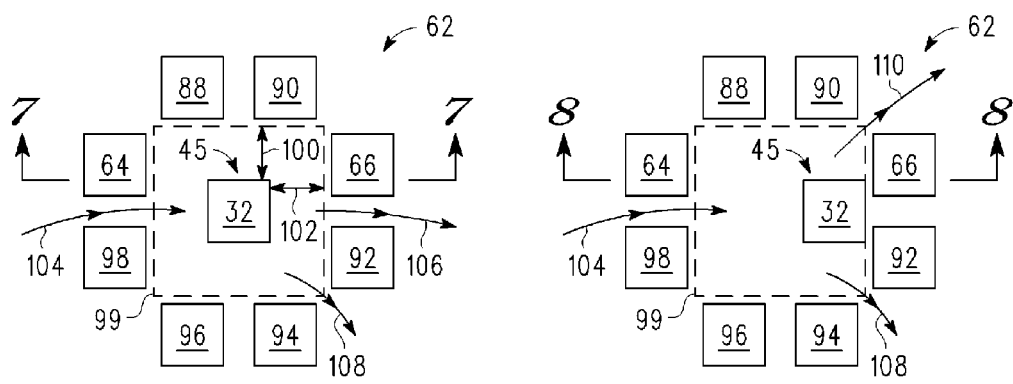
FIGS. 10 and 11 are diagram representations of a peg feature of the first die assembly and a containing feature of the second die assembly in greater detail for use in a 3-D semiconductor die structure with containing feature according to one embodiment of the present disclosure.

FIGS. 10 and 11 are diagram representations of a peg feature 45 of the first die portion 10 and a containing feature 62 of the second die portion 50 in greater detail for use in a 3-D semiconductor die structure with containing feature according to one embodiment of the present disclosure. In particular, FIG. 10 provides a top-down view of peg 45 which comprises a thinned peg feature 32 (with an overlying reflowed metal 44 not shown for ease of illustration). FIG. 10 further provides a top-down view of containing feature 62. As discussed earlier herein, containing feature 62 comprises elements 64 and 66. Containing feature 62 includes further elements 88, 90, 92, 94, 96, and 98, which are similar in nature to elements 64 and 66. The illustration of FIG. 10 further shows a desired spacing between peg 45 and the surrounding elements of the containing feature 62. In particular, when approximately centered between the elements of containing feature 62, peg 45 is spaced from the containing feature by an amount on the order of the placement misalignment of the die portion containing peg 45 when it is picked and placed on the die portion containing features 64, 66, 88, 90, 92, 94, 96, and 98, as represented by arrows 100 and 102. A portion of the cross-section illustrated in FIG. 7, including peg 45 and elements 64 and 66, is taken along line 7-7 of FIG. 10.

Referring still to FIG. 10, elements 64, 88, 90, 66, 92, 94, 96, and 98, are spaced apart from adjacent ones thereof by an amount sufficient to enable an ingress and egress of the organic adhesive material, but not sufficient enough for peg 45 to pass between adjacent ones thereof. Accordingly, peg 45 is limited to movement within a containing area 99 defined by elements 64, 88, 90, 66, 92, 94, 96, and 98 of the containing feature 62. Ingress of viscous material can occur from any direction over and/or between two adjacent elements of the containing feature, such as indicated by reference numeral 104. Furthermore, egress of viscous material can occur in any direction not encountering ingress of viscous material, for example, as indicted by reference numerals 106 and 108. The viscous material corresponds to the organic adhesive material 70, as discussed previously herein.

FIG. 11 provides a top-down view of peg 45 and containing feature 62 similar to that illustrated in FIG. 10, with the following difference. In FIG. 11, peg 45 is shifted or moved with respect to the containing feature 62. In particular, peg 45 has moved to the right-hand side of the containing feature 62, but prevented from moving further to the right by the presence of elements 66 and 92. As discussed above, the spacing between adjacent elements of the containing feature is sufficient for ingress and egress of organic adhesive material but not sufficient to allow peg 45 from moving beyond the boundary 99 of the containing feature. Ingress of viscous material can occur from any direction over and/or between two adjacent elements of the containing feature, such as indicated by reference numeral 104. Furthermore, egress of viscous material can occur in any direction not encountering ingress of viscous material, for example, as indicted by reference numerals 108 and 110. In FIG. 11, the previous egress 106 of FIG. 10 is blocked by the presence of peg 45 adjacent elements 66 and 92. Furthermore, a portion of the cross-section illustrated in FIG. 8, including peg 45 and elements 64 and 66, is taken along line 8-8 of FIG. 11.

The number and configuration of the elements 64, 88, 90, 66, 92, 94, 96, and 98 of containing feature 62 can be different from those illustrated in the figures. The specific dimensions, configuration or arrangement, and interspacing between adjacent elements can be selected according to the requirements of a given 3-D semiconductor die structure with a containing feature, as disclosed herein. In addition, the peg and mircropad of a first die portion and the containing feature and micropad of a second die portion form complementary features of the first die portion and the second die portion in the resultant 3-D semiconductor die structure.

The semiconductor substrate described herein can be any semiconductor material or combinations of materials, such as gallium arsenide, silicon germanium, silicon-on-insulator (SOI), silicon, monocrystalline silicon, the like, and combinations of the above.

By now it should be appreciated that there has been provided a die-on-die assembly, comprising: a first die having a first contact extension and having a peg extending a first height above the first die; and a second die having a second contact extension connected to the first contact extension and having a containing feature extending a second height above the second die surrounding the peg, wherein the peg extends past the containing feature. The peg can comprise a first metal adjacent to the first die and a second metal on an end of the peg away from the first die. In one embodiment, the second metal comprises tin, wherein the first height is greater than the second height. In another embodiment, an area of the first metal at an interface with the second metal is less than 144 square microns. According to another embodiment, a sum of the first height and the second height exceeds a sum of a height of the first contact extension and a height of the second contact extension.

In a further embodiment, the containing feature comprises a plurality of elements extending from the second die defining an area of constrained movement, wherein the peg is within the area of constrained movement. In a yet further embodiment, the containing feature is for restricting movement of the second die in relation to the first die so that the first external contact is aligned to the second external contact within a predetermined tolerance. In a still further embodiment, the first die is further characterized as having a second peg; and the second die is further characterized as having a second containing area extending the second height above the second die surrounding the second peg.

According to another embodiment, a method of forming a die-on-die assembly comprises forming a first external contact on a first semiconductor die, forming a first seed layer over the first semiconductor die including over the first external contact, forming a first photoresist layer over the first seed layer having a first opening and a second opening, wherein the first opening is over the first external contact, performing a plating step to cause formation of a first plated contact in the first opening and a peg in the second opening, removing the first photoresist layer, and removing the first seed layer in areas adjacent to the first plated contact and the peg. The method further comprises forming a second external contact on a second semiconductor die, forming a second seed layer over the second semiconductor die including over the second external contact, forming a second photoresist layer over the second seed layer having a third opening and a ring opening, wherein the third opening is over the second external contact, performing a plating step to cause formation of a second plated contact in the third opening and a containing feature in the ring opening useful in defining a contained area useful in constraining movement between the first semiconductor die and the second semiconductor die, removing the second photoresist layer, and removing the second seed layer in areas adjacent to the second plated contact and the containing feature. The method still further comprises placing the first semiconductor die in contact with the second semiconductor die such that the first plated contact is in contact with the second plated contact and the peg is within the contained area.

In another embodiment, the step of performing a plating step to cause formation of the first plated contact in the first opening and the peg in the second opening is further characterized by the peg being formed to a height greater than a height of the first plated contact. In addition, the step of performing a plating step to cause formation of the first plated contact in the first opening and the peg in the second opening is further characterized by forming a first plated portion in the first opening, a first peg portion in the second opening, a first metallic layer on the first plated portion, and a second metallic layer on the first peg portion. Furthermore, the step of performing a plating step to cause formation of the first plated contact in the first opening and the peg in the second opening is further characterized by the first metallic layer and the second metallic layer comprising tin. Moreover, the step of forming the first photoresist layer is further characterized by the first opening having an area greater than an area of the second opening. Still further, the step of removing the seed layer is further characterized by reducing the width of the peg so that a top surface of the first peg portion has an area of not greater than 144 square microns.

According to a further embodiment, the step of forming the second photoresist layer is further characterized by the ring opening comprising a plurality of openings in the second photoresist layer that are arranged in a closed loop. The step of performing the plating step to cause formation of a second plated contact in the third opening and a containing feature in the ring opening is further characterized by the containing feature being formed in the plurality of openings so that the containing feature comprises a plurality of elements of metal arranged in the closed loop.

According to another embodiment, the method further includes: the step of forming a first photoresist layer over the first seed layer further characterized by the first photoresist layer having a fifth opening; the step of performing a plating step to cause formation of a first plated contact in the first opening and a peg in the second opening further characterized as forming a second peg in the fifth opening; the step of removing the first seed layer in areas adjacent to the first plated contact and the peg also removes the first seed layer adjacent to the second peg; the step of forming the second photoresist layer over the second seed layer further characterized as by the second photoresist layer having a second ring opening; the step of performing a plating step to cause formation of a second plated contact in the third opening and a containing feature in the ring opening further characterized as causing formation of a second containing feature in the second ring opening useful in defining a second contained area useful in constraining movement between the first semiconductor die and the second semiconductor die; the step of removing the second seed layer in areas adjacent to the second plated contact and the containing feature further characterized as removing the second seed layer adjacent to the second containing feature; and the step of placing the first semiconductor die in contact with the second semiconductor die further characterized by the second peg being within the second contained area.

According to another embodiment, a method of forming a die-on-die assembly, comprises: forming a first contact extension on a first semiconductor die extending from the first semiconductor die and forming a first peg and a second peg on the first semiconductor die; forming a second contact extension on a second semiconductor die and forming a first containing feature surrounding a first contained area and a second containing feature surrounding a second contained area; placing the first contact extension in contact with the second contact extension, the first peg in the first contained area, and the second peg in the second contained area; and thermal compression bonding the first contact extension and the second contact extension together while lateral movement of the first and second contact extensions is constrained to a predetermined amount by the first peg being in the first contained area and the second peg being in the second contained area. In a further embodiment, at least one of the steps of forming the first contact extension and the steps of forming the second contact extension is further characterized as performing a deposition and anneal of tin, wherein a sum of a height of the first contact extension and a height of the second contact extension is less than a sum of a height of the first peg and a height of the first contained area.

Because the apparatus implementing the present invention is, for the most part, composed of components known to those skilled in the art, specific details thereof will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the first die may contain both pegs and containing features, wherein the second die contains complementary corresponding ones of containing features and pegs. In addition, the embodiments of the present disclosure can be implemented with respect to 3D integrations used on any technology generation, now and into the future. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A die-on-die assembly, comprising:
   a first die having a first contact extension and having a peg extending a first height above the first die, wherein the peg is displaced on the surface of the die from the first contact extension; and
   a second die having a second contact extension connected to the first contact extension and having a containing feature extending a second height above the second die surrounding the peg, wherein
      the peg extends past the containing feature, and
      the containing feature comprises a plurality of features extending to the second height, each of the plurality of features being spaced apart from adjacent ones of the plurality of features by a distance sufficient to enable ingress and egress of a die attachment adhesive material, but the distance being insufficient for the peg to pass between adjacent features.

2. The die-on-die assembly of claim 1, wherein the peg comprises a first metal adjacent to the first die and a second metal on an end of the peg away from the first die.

3. The die-on-die assembly of claim 2, wherein the second metal comprises tin.

4. The die-on-die assembly of claim 3, wherein the first height is greater than the second height.

5. The die-on-die assembly of claim 4, wherein an area of the first metal at an interface with the second metal is less than 144 square microns.

6. The die-on-die assembly of claim 2, wherein the first height is greater than the second height.

7. The die-on-die assembly of claim 2, wherein an area of the first metal at an interface with the second metal is less than 144 square microns.

8. The die-on-die assembly of claim 2, wherein a sum of the first height and the second height exceeds a sum of a height of the first contact extension and a height of the second contact extension.

9. The die-on-die assembly of claim 2, wherein the containing feature comprises a plurality of elements extending from the second die defining an area of constrained movement, wherein the peg is within the area of constrained movement.

10. The die-on-die assembly of claim 2, wherein the containing feature is for restricting movement of the second die in relation to the first die so that the first contact extension is aligned to the second contact extension within a predetermined tolerance.

11. The die-on-die assembly of claim 2, wherein:
    the first die is further characterized as having a second peg displaced from both the first contact extension and the peg; and
    the second die is further characterized as having a second containing area extending the second height above the second die surrounding the second peg.

12. The die-on-die assembly of claim 1, wherein a sum of the first height and the second height exceeds a sum of a height of the first contact extension and a height of the second contact extension.

13. The die-on-die assembly of claim 12, wherein the containing feature comprises a plurality of elements extending from the second die defining an area of constrained movement, wherein the peg is within the area of constrained movement.

14. The die-on-die assembly of claim 12, wherein the containing feature is for restricting movement of the second die in relation to the first die so that the first contact extension is aligned to the second contact extension within a predetermined tolerance.

15. The die-on-die assembly of claim 12, wherein:
    the first die is further characterized as having a second peg displaced from both the first contact extension and the peg; and
    the second die is further characterized as having a second containing area extending the second height above the second die surrounding the second peg.

16. The die-on-die assembly of claim 1, wherein the containing feature comprises a plurality of elements extending from the second die defining an area of constrained movement, wherein the peg is within the area of constrained movement.

17. The die-on-die assembly of claim 16, wherein:
    the first die is further characterized as having a second peg displaced from both the first contact extension and the peg; and
    the second die is further characterized as having a second containing area extending the second height above the second die surrounding the second peg.

18. The die-on-die assembly of claim 1, wherein the containing feature is for restricting movement of the second die in relation to the first die so that the first contact extension is aligned to the second contact extension within a predetermined tolerance.

19. The die-on-die assembly of claim 1, wherein:
the first die is further characterized as having a second peg displaced from both the first contact extension and the peg; and
the second die is further characterized as having a second containing area extending the second height above the second die surrounding the second peg.

20. The die-on-die assembly of claim 1, wherein the first height is greater than the second height.

* * * * *